United States Patent [19]
Ikeda

[11] Patent Number: 6,081,441
[45] Date of Patent: Jun. 27, 2000

[54] CONTENT-ADDRESSABLE MEMORY

[75] Inventor: Setsuko Ikeda, Kawasaki, Japan

[73] Assignee: NEC Corporation, Tokyo, Japan

[21] Appl. No.: 09/197,193

[22] Filed: Nov. 20, 1998

[30]     Foreign Application Priority Data

Nov. 21, 1997  [JP]  Japan ..................... 9-338105

[51] Int. Cl.$^7$ ................................................. G11C 15/00
[52] U.S. Cl. ...................................... 365/49; 365/185.25
[58] Field of Search .................................. 365/49, 185.25

[56]            References Cited

U.S. PATENT DOCUMENTS

| 5,319,589 | 6/1994 | Yamagata et al. | 365/49 |
| 5,345,411 | 9/1994 | Yoneda | 365/49 |
| 5,828,593 | 10/1998 | Schultz et al. | 365/49 |

FOREIGN PATENT DOCUMENTS 62-293596  12/1987  Japan .

*Primary Examiner*—David Nelms
*Assistant Examiner*—Anh Phung
*Attorney, Agent, or Firm*—Hutchins, Wheeler & Dittmar

[57]            ABSTRACT

Match selection circuits are connected to respective ones of match lines connecting corresponding rows of CAM cells associated with word lines. A match selection control circuit, the inputs of which are the word lines, generates match line inhibit signals that inhibit a search when a data search is conducted in the CAM. On the basis of a precharge signal from a control circuit and a match line inhibit signal from the match selection control circuit applied thereto, the match selection circuits inhibit a data search in row-direction CAM cells connected to the match lines that are connected to these match selection circuits, respectively, thereby specifying a data search range in terms of individual word lines. A match line corresponding to each word line in the specified search range attains a non-match state regardless of whether the result of a search is a match or non-match. Thus a data search range is specified by the positions of selected word lines. The number of data search operations is reduced and less power is consumed when the CAM operates.

16 Claims, 9 Drawing Sheets

CONTENT-ADDRESSABLE MEMORY

FIELD OF THE INVENTION

This invention relates to a content-addressable memory (generally associative memory) composed of content-addressable memory cells that use match detection signals. More particularly, the invention relates to a content-addressable memory storage device in which the number of matching operations is reduced.

BACKGROUND OF THE INVENTION

A content-addressable memory referred to as a "CAM" below) compares data stored in memory in advance and externally applied search data, determines if there is stored data that matches and extracts the address of the stored data if a match is obtained.

FIG. 6 is a diagram illustrating an example of the structure of a CAM according to the prior art. Here, one bit represents one word, and the CAM is shown in a structure without column.

As shown in FIG. 6, an array of CAM cells A11–Anm are arrayed in the form of a matrix. A selection control line (referred to as a "word line" below) WL1 extending in the row direction of the CAM cells and a match detection signal line (referred to as a "match line" below) ML1, which is for transmitting the result of match operation, extending in the row direction of the CAM cells are commonly connected to all the CAM cells A11–A1m in that row. Word lines WL2–WLn and match lines ML2–MLn are similarly commonly connected to all CAM cells in the corresponding rows. The word lines WL1–WLn are connected to an address decoder 100. The match line ML1 is connected to a match line precharging circuit 111 and to a match detection circuit 103. The other match lines ML2–MLn are similarly connected to match line precharging circuits 112–11n, respectively, and to the match detection circuit 103.

The match detection circuit 103 outputs the address of CAM cells for which a match with search data has been achieved. The match line precharging circuits 111–11n precharge the match lines ML1–MLn connected thereto to a predetermined potential on a per-word-line basis in response to a precharge signal PC from a control circuit 101.

A search data input circuit 120 has a data input line D1 and is controlled by the state of the precharge signal PC from the control circuit 101 to transmit search data to a pair of search data lines CD1, CD1B. Search data input circuits 121–12m are constructed in a manner similar to the search data input circuit 120 and operate in a similar manner.

The pair of search data lines CD1, CD1B are connected to all CAM cells A11–An1 in the corresponding column. Other pairs of search data lines CD2–CDm, CD2B–CDmB are similarly connected to all CAM cells of the corresponding columns.

The address decoder 100, which has input addresses A1–An, is controlled by a signal from the control circuit 101, which has a clock input CLK, and controls the selection of the word lines WL–WLn.

Data is stored in the memory portion of a CAM cell in advance. An example of the stored data is as follows:

WL1 row direction—A11, A12, A13, A1m: 0, 0, 0, 0
WL2 row direction—A21, A22, A23, A2m: 0, 1, 0, 1
WLn row direction—An1, An2, An3, Anm: 1, 1, 1, 1

Assume that search data is 1, 1, 1, 1. When all "1"s are applied as the data inputs D1–Dm, the search data is transmitted to all pairs of the search data lines CD1–CDm, CD1B–CDmB, respectively. At such time all bits of the stored data in the row-direction CAM cells An1–Anm of the word line WLn match the search data and a match signal is output on the match line MLn. The address of the row-direction CAM cells An1–Anm of the word line WLn is detected by the match detection circuit 103. When data is read out of another memory device using the detected address, information corresponding to the row-direction CAM data of the word line WLn of the CAM is obtained.

If multiple items of data that have been stored in the memory portions of the CAM cells are identical, e.g., WL1 row direction—A11, A12, A13, A1m: 0, 0, 0, 0
WL2 row direction—A21, A22, A23, A2m: 0, 1, 0, 1
WLn row direction—An1, An2, An3, Anm: 1, 1, 1, 1 then
some row-direction CAM cells of the word lines WLn and WL2 will provide a match with search data in case where the search data is 1, 1, 1, 1.

If the information that corresponds to the row-direction CAM data of the word line WL2 of the CAM is desired, first the address of the row-direction CAM cells of the word line WLn is detected and information is obtained by reading data out of the other memory device using this address. Next, the address of the row-direction CAM cells of the word line WL2 is detected and data in the other memory device is read out using this address, whereby information corresponding to row-direction CAM data of the word line WL2 of the CAM is obtained. If the data stored in the memory portions of CAM cells provide multiple matches with search data on a per-word line basis, then the number of retrievals will be equivalent to the number of those word lines. The number of retrievals may thus indicate redundancy depending upon the content of the search data.

FIG. 7 is a diagram illustrating the construction of a CAM cell circuit according to the prior art.

As shown in FIG. 7, a CAM cell circuit includes a memory portion (static RAM) 212 and a comparator circuit portion 213 for comparing stored data and search data.

The memory portion 212 and comparator circuit portion 213 include inverters 201, 202 constructing a flip-flop, N-channel MOS transistors (referred to as "NMOS transistors" below) 203, 204, 205, 206, 207, a pair of search data lines CD 208, CD B 209, a word line WL 210 for controlling the writing of data to the memory portion, and a match line ML 211 for outputting whether or not a match is achieved in regard to the stored data and search data on the associated individual word line on the per-word line basis.

FIG. 8 illustrates one word portion of circuitry constituted by the CAM cell circuit shown in FIG. 7.

As shown in FIG. 8, CAM cells 311–31m are identical with the CAM cell shown in FIG. 7 and respective ones of the CAM cells are connected commonly by the pairs of search data lines CD1–CD1B to CDm–CDmB in the column direction.

The search data input circuits 120–12m are provided for respective columns and have data inputs D1–Dm. Further, the search data input circuits 120–12m are controlled by the precharge signal PC and transmit search data on the pairs of search data lines CD1, CD1B and CDm, CDmB. The search data line CD1B transmits data that is the inverse of the data on the search data line CD1.

The match line precharging circuit 111 is composed of a P-channel MOS transistor (referred to as a "PMOS transistor" below). The precharge signal PC enters the gate of this PMOS transistor. One diffusion layer (e.g., the source) is connected to a power supply VDD, and the other diffusion layer (the drain) is connected to match line ML1 of the CAMs in the row direction. The match line precharging circuit is provided for each individual match line in the row direction and precharges the match line in dependence upon the content of the precharge signal PC.

A word structure 321 in the row direction of the CAM cells comprises m-number of CAM cells commonly connected by the word line WL1 and match line ML1 in the row direction. Other word structures 322–32n in the row direction of the CAM cells also are commonly connected by word lines WL2–WLn and match lines ML2–MLn, respectively.

A search and compare operation will now be described with reference to FIG. 7.

In a search and compare operation, the match line ML of the associated word line is charged on the per-word-line basis to the VDD level (power-supply voltage) before search data is transferred on the pair of search data lines CD 208, CDB 209 (where the signal on CDB is the complement of the signal on CD). The search data is transferred to the pair of search data lines CD 208, CDB 209 via the search data input circuit so that a search and compare operation may be performed.

Assume that the search data and the stored data match. If the search data line CD 208 is at the VDD level (the search data line CDB 209, the data of which is the inverse of the data on CD 208, is at the ground GND level) and the stored data at node 214 is at the VDD level (the stored data at node 215 is at the GND level) in FIG. 7, then the NMOS transistor 205 whose gate is provided with the potential at node 214 is rendered conductive (the NMOS transistor 206 is rendered non-conductive) so that the potential on search data line CD 208 is transmitted to the gate of the NMOS transistor 207 via the NMOS transistor 205. Consequently, the gate of the NMOS transistor 207 assumes the high level and the NMOS transistor 207 conducts. The potential on the precharged match line ML 211 is discharged to the ground potential via the NMOS transistor 207.

Assume that the search data and the stored data do not match. If the search data line CD 208 is at the ground level (the search data line CDB 209, the data of which is the inverse of the data on CD 208, is at the VDD level) and the stored data at node 214 is at the VDD level (the stored data at node 215 is at the ground level) in FIG. 7, then the NMOS transistor 205 is rendered conductive (the NMOS transistor 206 is rendered non-conductive) so that the potential of search data line CD 208 is transmitted to the gate of the NMOS transistor 207 via the NMOS transistor 205. The gate of the NMOS transistor 207 reverts to the low level and the NMOS transistor 207 is rendered non-conductive. As a result, the match line ML 211 remains at the precharge potential.

As shown in FIGS. 6 and 8, the CAM cells of each word line are all commonly connected by the match line of that row. Therefore, if the result of a search is a match at any one cell in the row, the match line of the associated word line is discharged to the ground level. If the result of a search is a non-match at all cells, then the match line of the associated word line is held at the precharge potential.

FIG. 9 is a timing chart showing the operation of a CAM circuit according to the prior art. The clock CLK and the precharge signal PC are in synchronization and in phase. When the clock is at the high level (clock 1), this corresponds to the CAM data search interval. When the clock is at the low level (clock 2), this corresponds to the match line precharge interval.

If the VDD level of the precharge signal PC enters the gate of the PMOS transistor in the match line precharging circuit 111, which is constituted by this PMOS transistor, during clock 1 (the CAM data search interval), the PMOS transistor is rendered non-conductive (turned off) and precharging is terminated.

The potential of the precharged match line varies depending upon the result of the data search in the CAM. If the result of the search is a match, the match line goes to ground potential. If the result of the search is a non-match, on the other hand, then the match line is maintained at the precharge potential. Assume that the search data is transmitted to the search data lines at the same time that the clock CLK rises and that the search data does not change in one cycle. When the search data enters from the data input D, the search data is output from the search data input circuit and is transmitted over the pair of search data lines CD, CDB.

If the GND level of the precharge signal PC enters the gate of the PMOS transistor in the match line precharging circuit 111 during clock 2 (the match line precharge interval), the PMOS transistor is rendered conductive (turned on). As a result, the VDD level is transmitted to the match line and the match line of the associated word line is precharged to the VDD level. Further, when the GND level of the precharge signal PC is input to the search data input circuit, the latter transmits the GND potential over the pair of search data lines CD, CDB regardless of the content of the search data. The gate of the NMOS transistor 207, therefore, is turned off and, as a result, the precharge on the match line is not affected.

Cycle A is for a case where the search data and stored data match. Since the result of the search is a match, the match line ML is discharged from the precharge potential to the ground potential in the CAM data search interval of clock 1. When the clock subsequently assumes the low level (clock 2), the match line ML is precharged.

Cycle B is for a case where the search data and stored data do not match. Since the result of the search is a non-match, the match line ML is held at the precharge potential in the CAM data search interval of clock 1. When the clock subsequently assumes the low level (clock 2), a transition is made to the match line precharge interval but the match line remains at the precharge potential.

The determination as to whether the search in the CAM has resulted in a match or non-match is made by detecting the potential level of the match line ML by the match detection circuit 103 of FIG. 6 in the CAM data search interval of clock 1.

A conventional content-addressable memory device disclosed in the specification of Japanese Patent Kokai Publication JP-A-62-293596 (1987) is such that one word is composed of n bits. The device comprises a decoder which performs a word selection for writing in n-bit data, a first content-addressable memory cell array in which one word is composed of m bits, a first sensing amplifier for sensing the result of a comparison performed by the first content-addressable memory cell array, a second content-addressable memory cell array, in which one word is composed of n-m bits, for performing a comparison operation using the output of the first sensing amplifier, and a second sensing amplifier for sensing the results of comparison by the second content-addressable memory cell array in dependence upon the output of the first sensing amplifier, whereby it is intended that less power is consumed at the time of the comparison operation.

SUMMARY OF THE DISCLOSURE

According to the investigations toward the present invention, it has turned out that the prior-art CAM described above has a number of problems, will now be described.

One problem is that a large number of search operations is required to achieve a single match. The reason for this is as follows:

A data search in the conventional CAM is carried out for every address and every word and searches may become redundant, or may be performed a number of times equivalent to the number of word lines, depending upon the content of the search data. In other words, if, when data in another memory device is read out using an address that has been detected in the CAM, multiple of items of data that have been stored in the memory portions of the CAM cells are identical, searches are conducted until the desired information is obtained and the number of times this is done is the same as the number of identical items of stored data.

Another problem is the flow of unnecessary current, which results in increased power consumption.

When a match is obtained as the result of a data search in CAM cells all connected to match lines of associated word lines in a content-addressable memory device composed of the conventional CAM cells, the match lines are charged and discharged by the conduction of transistors in the data search portions of the CAM cells. Consequently, the number of words and the bit length are large and an increase in power consumption is the result. The reason for this is that when the results of comparison in regard to an individual word line is indicative of a total match, all of the data search portions of the CAM cells operate, the potential of the match line charged prior to the search operation is discharged and needless power is produced.

Accordingly, an object of the present invention is to provide a content-addressable memory in which the number of data search operations is reduced and less power is consumed when the CAM operates.

According to one aspect of the present invention, the foregoing object is attained by providing a content-addressable memory having an address decoder, a control circuit, search data input circuits for inputting retained data and search data to internal circuitry, match line precharge circuits for charging match-result signal lines (referred to as "match lines" below), and a match detection circuit for detecting whether a match has been obtained on a match line. The content-addressable memory comprises:

a match selection control circuit, to which word lines that are the outputs of the address decoder are connected as inputs, for providing, a predetermined potential (e.g., power-supply potential) as an inhibit signal for match lines that correspond to all word lines of an order higher or lower than a word line that has been selected by the address decoder. The content-addressable memory further comprises match selection circuits (i.e., match line-selective-discharge circuits), which are connected to respective match lines and to which the match line inhibit signals from the match selection control circuit and a precharge signal for charging match lines from the control circuit are input, for discharging match lines that correspond to the match line inhibit signals.

The content-addressable memory according to the present invention functions to input externally applied search data, which comprises a plurality of bits, and to compare the search data with internally stored data to determine if the data match. The content-addressable memory includes match selection circuits (511–51n in FIG. 1) connected to respective ones of match lines (ML1–MLn in FIG. 1), and a match selection control circuit (500 in FIG. 1) for controlling the match selection circuits. By specifying a search range in units of word lines and inhibiting compare searches in units of word lines that are outside the search range, compare searches are conducted only on the basis of the remaining individual word lines (i.e., only on the word lines within the specified search range).

According to a second aspect of the present invention, there is provided a content-addressable memory for externally inputting search data, which comprises a plurality of bits, comparing the search data with internally stored data and determining whether the search data matches the internally stored data, said content-addressable memory comprising:

match selection circuits connected to respective ones of match lines, each commonly connecting all row-direction CAM cells of a corresponding row on the per-word-line basis; and a match selection control circuit for controlling said match selection circuits;

wherein by specifying, on the per-word-line basis, a data search range by a position of a word line that has been selected by an address decoder and by inhibiting compare search on the per-word-line basis outside the specified data search range, a compare search is conducted only on the remaining individual word line(s) on the per-word-line basis.

Further aspects and features of the present invention are disclosed in the appended dependent claims, the entire contents and/or features of which are herein incorporated by reference thereto, in combination and/or individually of each feature or element contained in each claim or paragraph.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENTS

A mode for practicing the present invention will be described below.

In preferred embodiments of the present invention, the number of search operations is reduced by specifying row-direction CAM cells of individual word lines (on the per-word-line basis) that do not require searching and specifying a range of row-direction CAM cells of individual word lines that do require searching (per word line unit). Further, there is provided specifying means that specifies a range of row-direction CAM cells of individual word lines (on the per-word-line basis) that do not undergo a search in regard to search data. The search operation is conducted in CAM cells other than the row-direction CAM cells of individual word lines specified by the specifying means.

More specifically, according to a preferred embodiment of the present invention, there is provided a content-addressable memory for inputting externally applied search data, which comprises a plurality of bits, and comparing the search data with internally stored data to determine if the input search data and the stored data match. Respective ones of match selection circuits (511–51n in FIG. 1) are connected to respective ones of match lines (ML1–MLn in FIG. 1), each of which is commonly connected to row-direction CAM cells in a row of corresponding individual word line (i.e., on the per-word-line basis). A match selection control circuit (500 in FIG. 1), to which the word lines are connected as inputs, generates a match line inhibit signal(s) that inhibits a search(es) when a data search(es) is(are) conducted in the content-addressable memory. On the basis of a precharge signal PC from a control circuit (101 in FIG. 1) and a match line inhibit signal from the match selection control circuit (500) applied thereto, one or more match selection circuits inhibit a data search(es) in row-direction CAM cells connected to certain specific match lines that are connected to these match selection circuits, thereby specifying a data search range in terms of individual word lines. In this case a match line corresponding to any individual word line(i.e., on the per-word-line basis) in the specified search range attains a non-match state regardless of whether the result of a search is a match or non-match. Thus a data search range is specified by the positions of selected word lines.

DETAILED DESCRIPTION OF THE PREFERRED EMBODIMENTS

Preferred embodiments of the present invention will now be described in detail with reference to the drawings.

Figure 1:
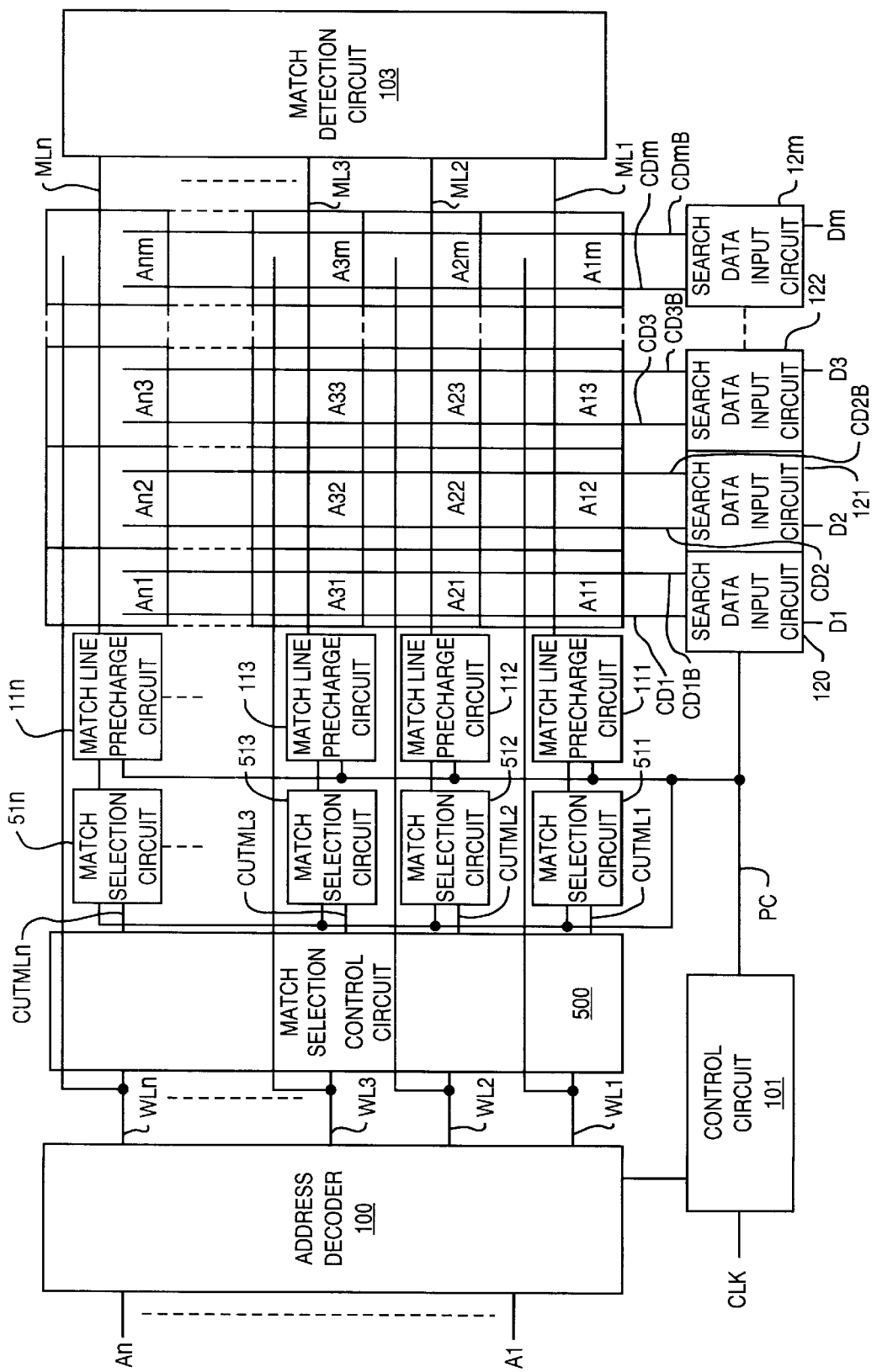
FIG. 1 is a block diagram illustrating the construction of a content-addressable memory according to a first embodiment of the present invention.

FIG. 1 is a block diagram illustrating the construction of a CAM according to a first embodiment of the present invention.

As shown in FIG. 1, the array CAM cells A11–Anm are arrayed (and connected) in the form of a matrix. The word lines A11–WLn extending in the row direction of the CAM cells are connected to the address decoder 100. The word line WL1 and the match line ML1 are commonly connected to all the CAM cells A11–A1m in that row. Word lines WL2–WLn and match lines ML2–MLn are similarly commonly connected to all CAM cells in the corresponding rows. The match lines ML1–MLn are commonly connected to match selection circuits 511–51n, respectively, to match line precharging circuits 111–11n, respectively, and via the CAM cells ultimately to the match detection circuit 103. The match detection circuit 103 detects the address of a CAM cells at which search data and stored data match.

A match selection control circuit 500, to which the word lines WL1–WLn are connected as inputs, transmits match line inhibit signals CUTML1–CUTMLn to the match selection circuits 511–51n, respectively. On the basis of the precharge signal PC from the control circuit 101, to which the clock signal CLK is input, and the match line inhibit signals CUTML1–CUTMLn from the match selection control circuit 500, the match selection circuits 511–51n place the match lines ML1–MLn in the match state, thereby inhibiting a search of data at the row-direction CAM cells connected to the match lines ML1–MLn.

The match line precharging circuits 111–11n precharge the match lines ML1–MLn connected thereto to a predetermined potential on a per-word-line basis in response to the precharge signal PC from the control circuit 101. The search data input circuit 120 has the data input line D1 and is controlled by the precharge signal PC from the control circuit 101 to transmit search data to the pair of search data lines CD1, CD1B. The search data input circuits 121–12m are constructed in a manner similar to the search data input circuit 120 and operate in a similar manner.

The pair of search data lines CD1, CD1B are connected to all CAM cells A11–An1 in the corresponding column. The other pairs of search data lines CD2–CDm, CD2B–CDmB are similarly connected to all CAM cells of the corresponding columns.

The address decoder 100, which has input addresses A1–An, is controlled by a signal from the control circuit 101 and controls the selection of the word lines WL1–WLn.

Figure 2:
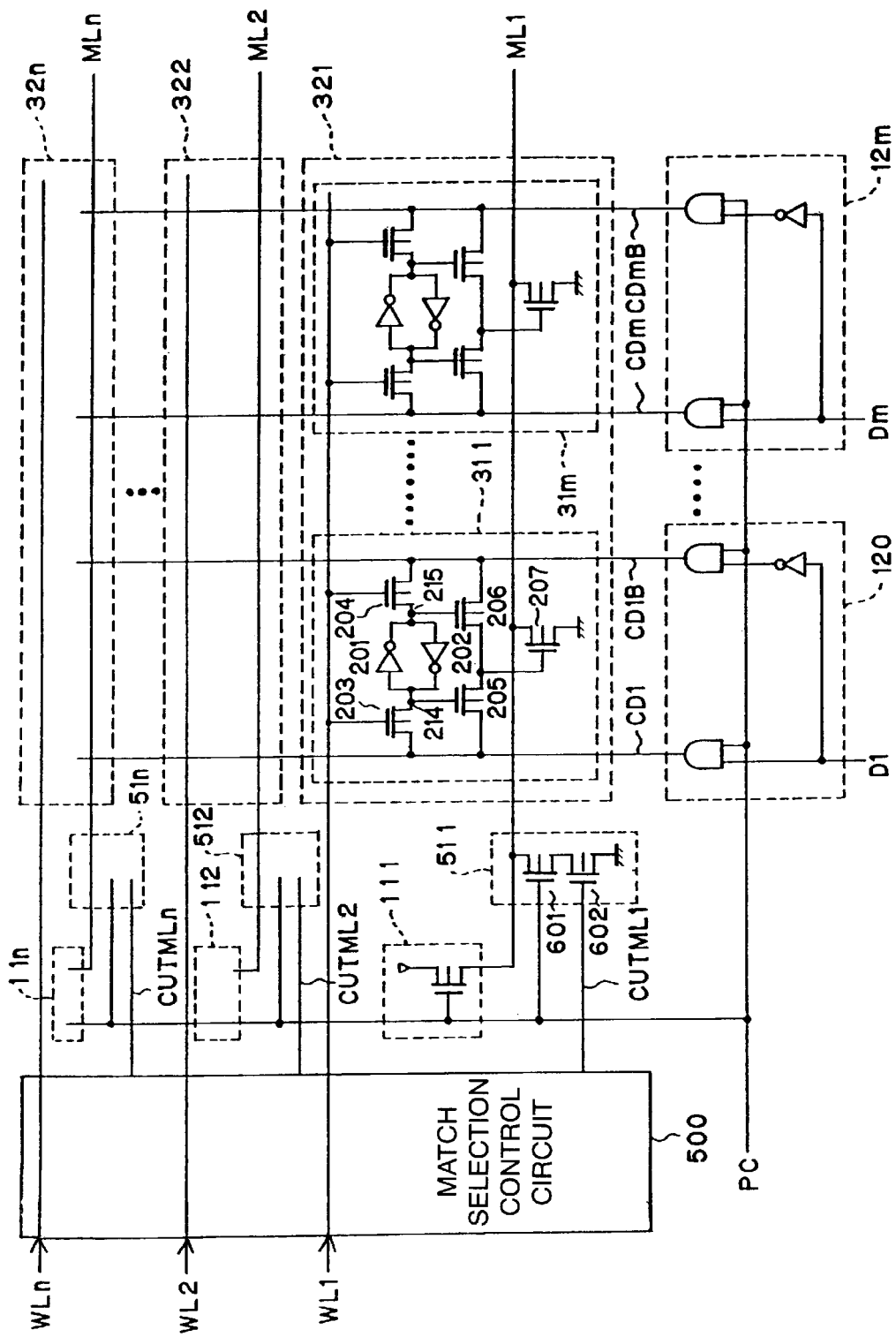
FIG. 2 is a diagram showing one word of circuitry in the first embodiment.

FIG. 2 is a diagram showing the construction of a portion of the CAM of FIG. 1 that corresponds to one word (or word line).

Figure 7:
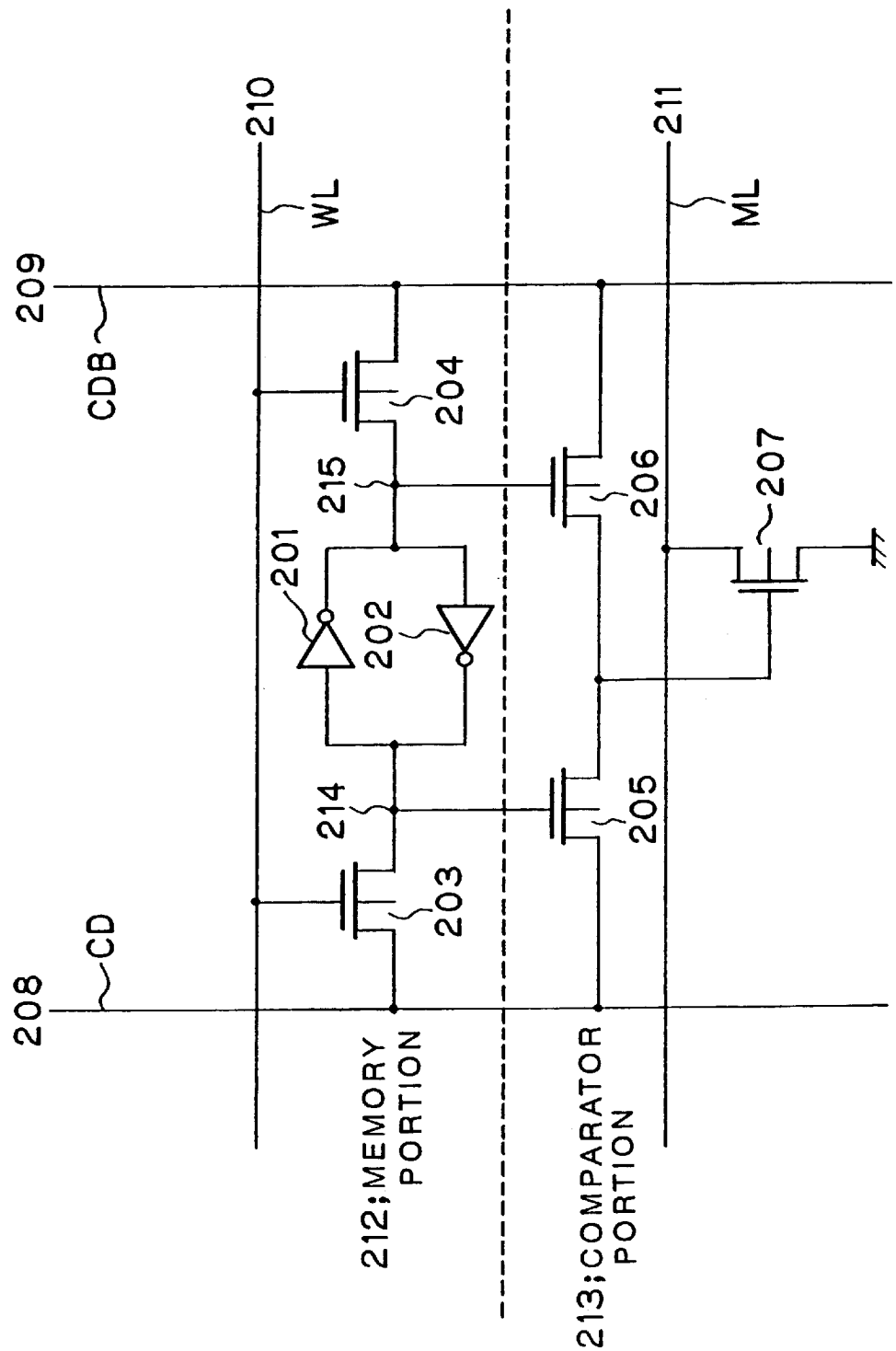
FIG. 7 is a diagram showing the construction of circuitry in a CAM cell according to the prior art.
Figure 8:
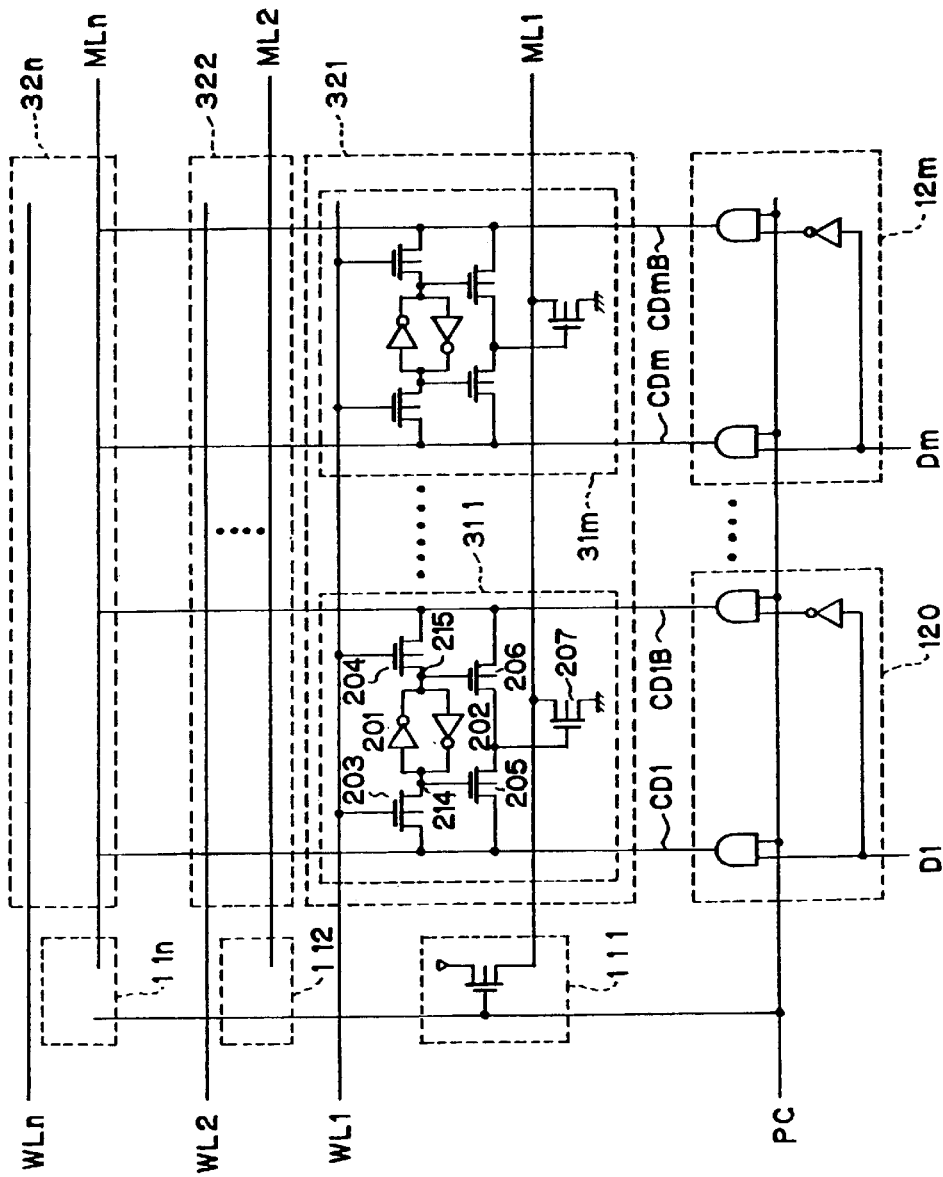
FIG. 8 is a diagram showing one word of circuitry in FIG. 6.
Figure 9:
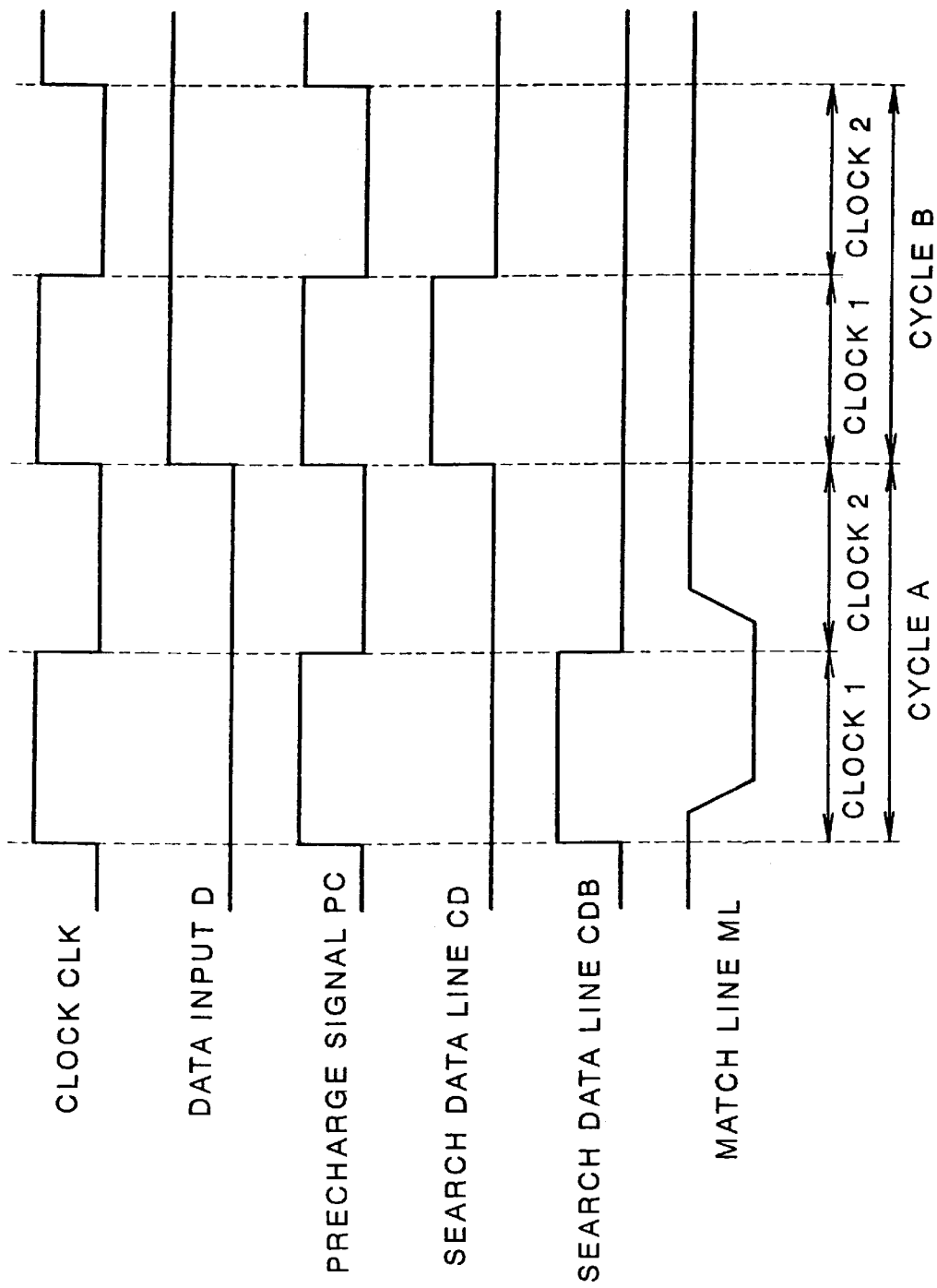
FIG. 9 is a timing chart for describing the operation of a content-addressable memory according to the prior art.

As shown in FIG. 2, the CAM cells 311–31m are identical with the CAM cell shown in FIG. 7 of the prior art and respective ones of the CAM cells are connected commonly by the pairs of search data lines CD1–CDm, CD1B–CDmB in the column direction.

The search data input circuit 120 is controlled by the precharge signal PC and transmits search data on the pair of search data lines CD1, CD1B. The search data line CD1B transmits data that is the inverse of the data on the search data line CD1. The same holds true for the other pair of search data lines CDm, CDmB. The search data input circuits 120–12m are provided on a column-by-column-basis.

The address decoder 100, which has the input addresses A1–An, is controlled by a signal from the control circuit 101 and controls the selection of the word lines WL1–WLn. The word (line) structure 321 in the row direction of the CAM cells comprises m-number of CAM cells all connected by the word line WL1 and match line ML1 in the row direction. Other word (line) structures 322–32n in the row direction of the CAM cells also are all connected by word lines WL2–WLn and match lines ML2–MLn, respectively. The match line ML1 connecting all of the CAM cells in that row is connected to the match line precharging circuit 111 and to the match selection circuit 511.

The match line precharging circuit 111 is constituted by a PMOS transistor. The precharge signal PC is input to the gate of the PMOS transistor, one diffusion layer thereof is connected to VDD and the other diffusion layer thereof is connected to the match line ML1 of the row-direction CAM cells.

In response to the precharge signal PC from the control circuit 101, the match line precharging circuits 111–11n precharge the respective match lines ML1–MLn connected thereto to the precharge potential on the per-word-line basis.

The match selection circuit 511 consists of an array of two stacked NMOS transistors 601, 602. The NMOS transistor 601 has a gate to which the precharge signal PC is applied, one diffusion layer connected to the match line ML1 and another diffusion layer connected the other diffusion layer which is common to the NMOS transistor 602. The NMOS transistor 602 has a gate to which the match line inhibit signal CUTML1 from the match selection control circuit 500 is applied. The diffusion layer of the NMOS transistor 602 that is not connected to the diffusion layer of the NMOS transistor 601 is connected to ground. The other match selection circuits 512–51n are similarly constructed.

The match selection control circuit 500, to which the word lines WL1–WLn are connected as inputs, transmits the match line inhibit signals CUTML1–CUTMLn to the match selection circuits 511–51n, respectively.

Figure 3:
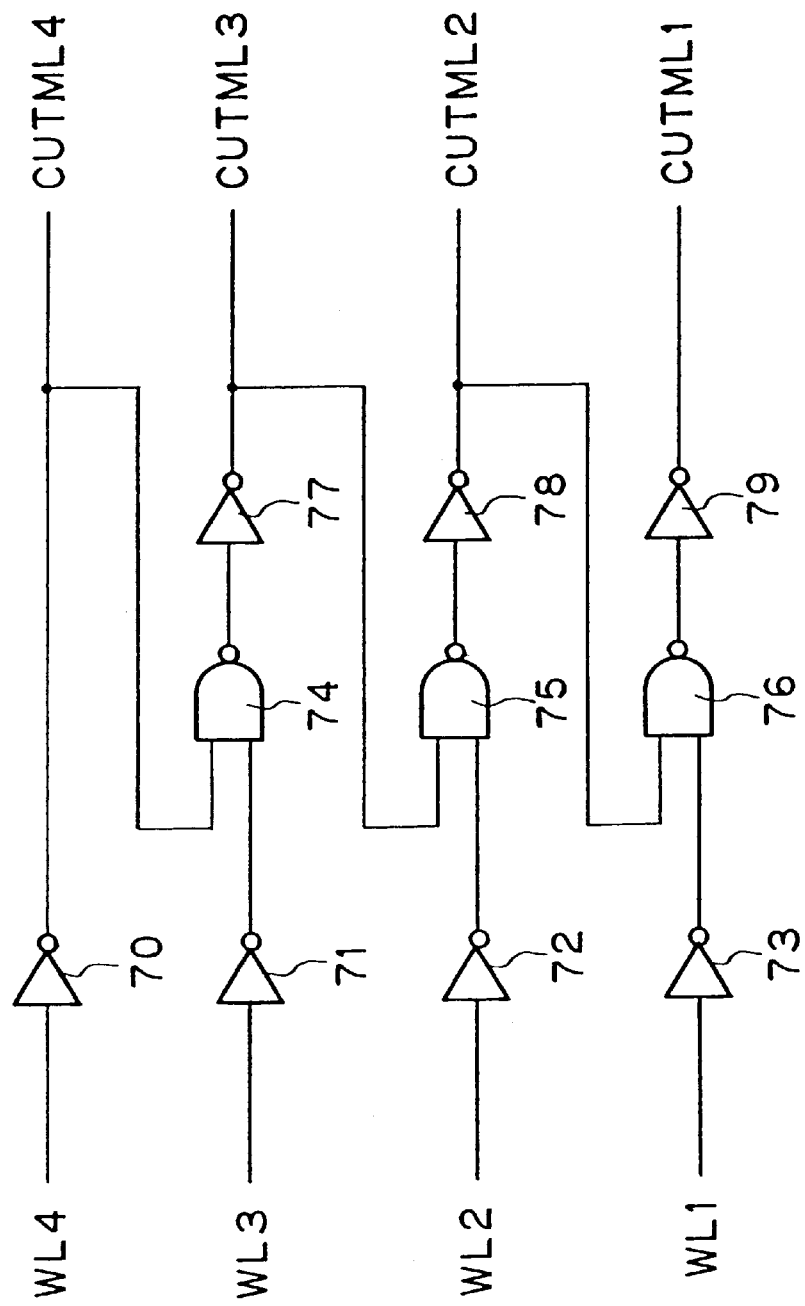
FIG. 3 is a circuit diagram showing the construction of a match selection control circuit according to the first embodiment.

FIG. 3 is a circuit diagram showing the construction of the match selection control circuit 500 of FIGS. 1 and 2 that corresponds to four words.

As shown in FIG. 3, the match selection control circuit 500 includes inverters 70, 71, 72, 73, 77, 78, 79 and 2-input NAND gates 74, 75, 76. When word line WL2 has been selected (i.e., when the potential on this word line has been raised from ground GND to the VDD level) by the content of an address, the potentials on the word lines WL1, WL2, WL3 and WL4 will be GND, VDD, GND and GND, respectively. The output (match line inhibit signal CUTML4) of the inverter 70, whose input is WL4, is the VDD potential. The output of the inverter 71, whose input is WL3, is input to the NAND gate 74, and the output (match line inhibit signal CUTML4) of the inverter 70 is also input to the NAND gate 74. When the output of the NAND gate 74 enters the inverter 77, the output (match line inhibit signal CUTML3) of the inverter 77 becomes the VDD potential.

The output of the inverter 72, whose input is WL2, is input to the NAND gate 75, and the output of the inverter 77 (match line inhibit signal CUTML3) also is input to the NAND gate 75. When the output of the NAND gate 75 enters the inverter 78, the output (match line inhibit signal CUTML2) of the inverter 78 becomes the GND potential. The output of the inverter 73, whose input is WL1, is input to the NAND gate 76, and the output of the inverter 78 (match line inhibit signal CUTML2) is also input to the NAND gate 76. When the output of the NAND gate 76 enters the inverter 79, the output (match line inhibit signal CUTML 1) of the inverter 79 becomes the GND potential.

Thus, the potentials of the match line inhibit signals CUTML1, CUTML2, CUTML3 and CUTML4 become GND, GND, VDD and VDD, respectively. The VDD potential is asserted all match line inhibit signals CUTML corresponding to word lines of addresses of an order higher than that of the selected word line. The states of the match line inhibit signals CUTML1–CUTMLn are decided by the states of the word lines WL1–WLn selected by the content of an address. In other words, a data search range can be specified for individual word lines by the positions of selected word lines. Further, depending upon the combination of circuits, it is possible to generate match line inhibit signals that correspond to word lines of addresses of an order lower than that of a selected word line.

Figure 4:
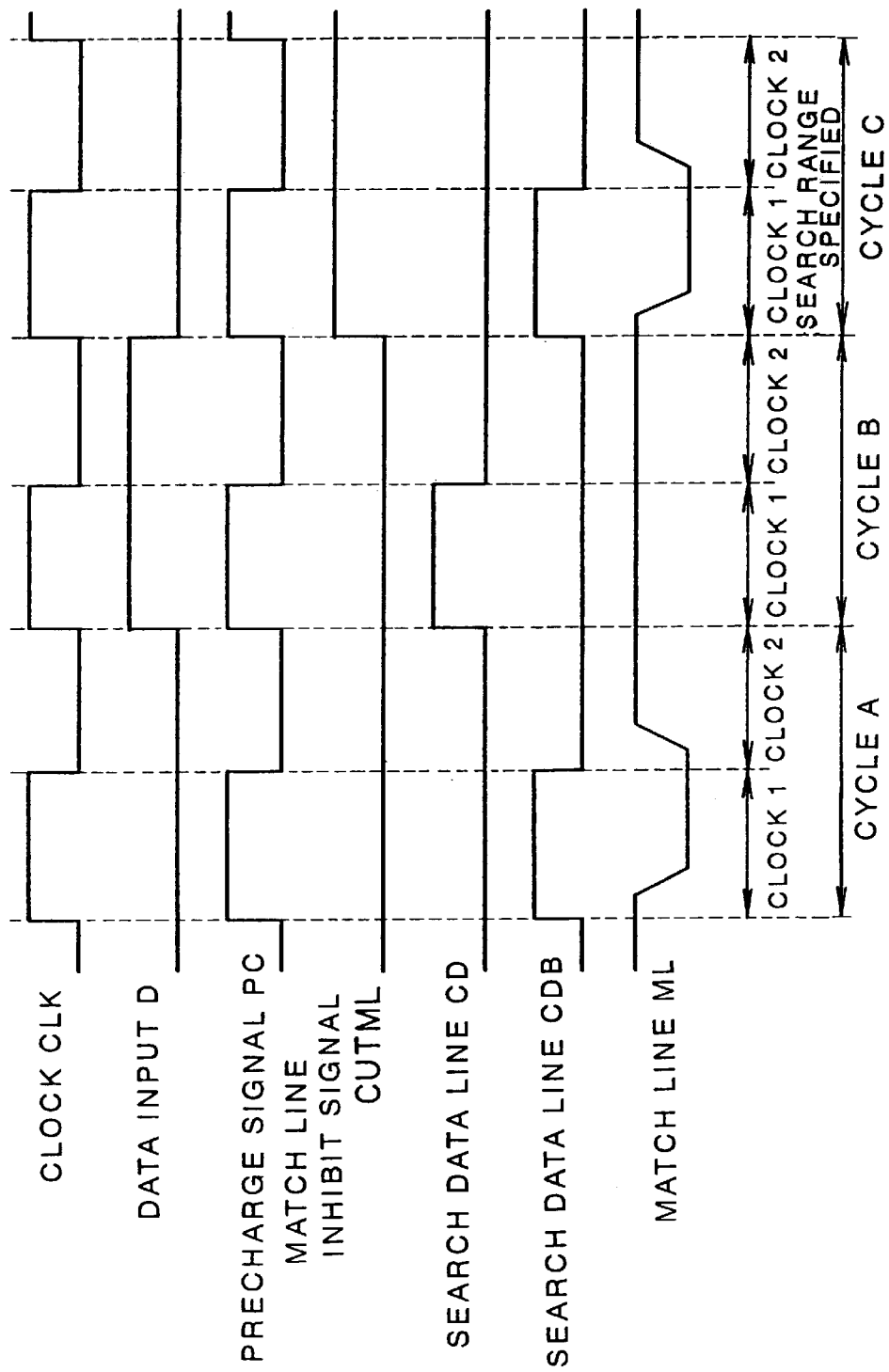
FIG. 4 is a timing chart for describing the operation of the first embodiment.

FIG. 4 is a timing chart illustrating the operation of the CAM according to this embodiment. The operation of the CAM will be described with reference to FIGS. 2 and 4. In searching and comparing, operation when search data matches stored data and operation when search data does not match stored data is as set forth above in the description of the prior art.

A match line of the associated word line (on the per-word-line basis) is charged to the VDD level (power-supply voltage) before search data is transferred on the pair of search data lines CD, CDB. The search data is applied to the data input D and is transferred to the pair of search data lines CD, CDB via the search data input circuit so that a search and compare operation may be performed.

The clock CLK and the precharge signal PC are in synchronization and in phase. When the clock is at the high level (clock 1), this corresponds to the CAM data search interval. When the clock is at the low level (clock 2), this corresponds to the match line precharge interval. The determination as to whether the search in the CAM has resulted in a match or non-match is made by detecting the potential level of the match line ML in the CAM data search interval of clock 1. This is as set forth in the description of the prior art.

In the interval of clock 1 (the CAM data search interval), it is assumed that the search data is transmitted to the search data lines at the same time that the clock CLK rises and that the search data does not change during one cycle. When the search data enters from the data input D, the search data is output from the search data input circuit and is transmitted over the pair of search data lines CD, CDB. Since the VDD level enters the gate of the PMOS transistor of match line precharging circuit 111 from the precharge signal PC, the PMOS transistor is turned off and precharging is terminated (search interval starts).

Since the VDD level enters the gate of the NMOS transistor 601 of match selection circuit 511, the NMOS transistor is turned on. The state of the input to the gate of the NMOS transistor 602 and the state of the match line inhibit signal CUTML1 are decided by the status (selected or non-selected) of the word line WL1.

When the word line WL1 is selected, the match line inhibit signal CUTML1 assumes the GND level owing to the action of the match selection control circuit 500; the other match line inhibit signals CUTML2–CUTMLn rise to the VDD level. If the match line inhibit signal CUTML1 (at the GND level) enters the match selection circuit 511 constructed by the two NMOS transistors 601, 602, the NMOS transistor 602 is turned off and the NMOS transistor 601 is turned on, as a result of which match line ML1 undergoes no change in potential.

The potential on the match line ML1 varies depending upon the results of a data search in the CAM. If the result of the search is a match, the match line assumes the GND potential. If the result of the search is a non-match, on the other hand, then the match line is maintained at the precharge potential. In the match selection circuits 512–51n to which the other match line inhibit signals CUTML2–CUTMLn (the VDD potential) are input, two NMOS transistors in each circuit are both turned ON, as a result of which the ground potential connected to the diffusion layers of the NMOS transistors to whose gates the match line inhibit signals CUTML2–CUTMLn are applied is transmitted over the match lines ML2–MLn, whereby these match lines are discharged from the precharge potential to GND.

In other words, the VDD potential is transmitted over all of the match line inhibit signals CUTML2–CUTMLn corresponding to the word lines of addresses of an order higher than that of the selected word line WL1. Regardless of whether the result of a data search in the CAM is a match or non-match, the match lines ML2–MLn are discharged from the precharge potential to the ground potential and a data search is not conducted, in the same way as when the result of the data search is indicative of a match. Thus the data search range can be specified (delimited) by the position of the selected word line.

If the GND level of the precharge signal PC enters the gate of the PMOS transistor in the match line precharging circuit 111 during clock 2 (the match line precharge interval), the PMOS transistor is rendered conductive (turned on). As a result, the VDD level is transmitted to the match line(s) and the match line(s) of the associated word line(s) is precharged to the VDD level and conducts. The NMOS transistor 601 of the match selection circuit 511 has the GND level applied to its gate and there is in the off state. As a result, the match line ML1 undergoes no change in potential regardless of the state of the match line inhibit signal CUTML1. The same is true for the other match lines ML2–MLn.

When the GND level of the precharge signal PC is applied to the search data input circuit, it transmits the GND potential over the pair of search data lines CD, CDBA regardless of the content of the search data and, hence, the NMOS transistor 207 turns off. As a result, the match line ML1 undergoes no change in the precharged potential.

Cycle A is for a case where the search data and stored data match. Since the result of the search is a match, the match line ML of the associated word line is discharged from the precharge potential to the GND potential in the CAM data search interval of clock 1. When the clock subsequently assumes the low level (clock 2), the match line ML is precharged again. This cycle is as set forth in the description of the prior art.

Cycle B is for a case where the search data and stored data do not match. Since the result of the search is a non-match, the match line ML is held at the precharge potential in the CAM data search interval of clock 1. When the clock subsequently assumes the low level (clock 2), there is a transition to the match line precharge interval but the match line remains at the precharge potential. This cycle is as set forth in the description of the prior art.

Cycle C is for a case where a search range is specified. In the CAM data search interval of clock 1, the match line ML corresponding to the associated word line is discharged from the precharge potential to the GND potential regardless of whether the result of the search is a match or non-match. When the clock subsequently assumes the low level (clock 2), the match line ML is precharged again.

Figure 5:
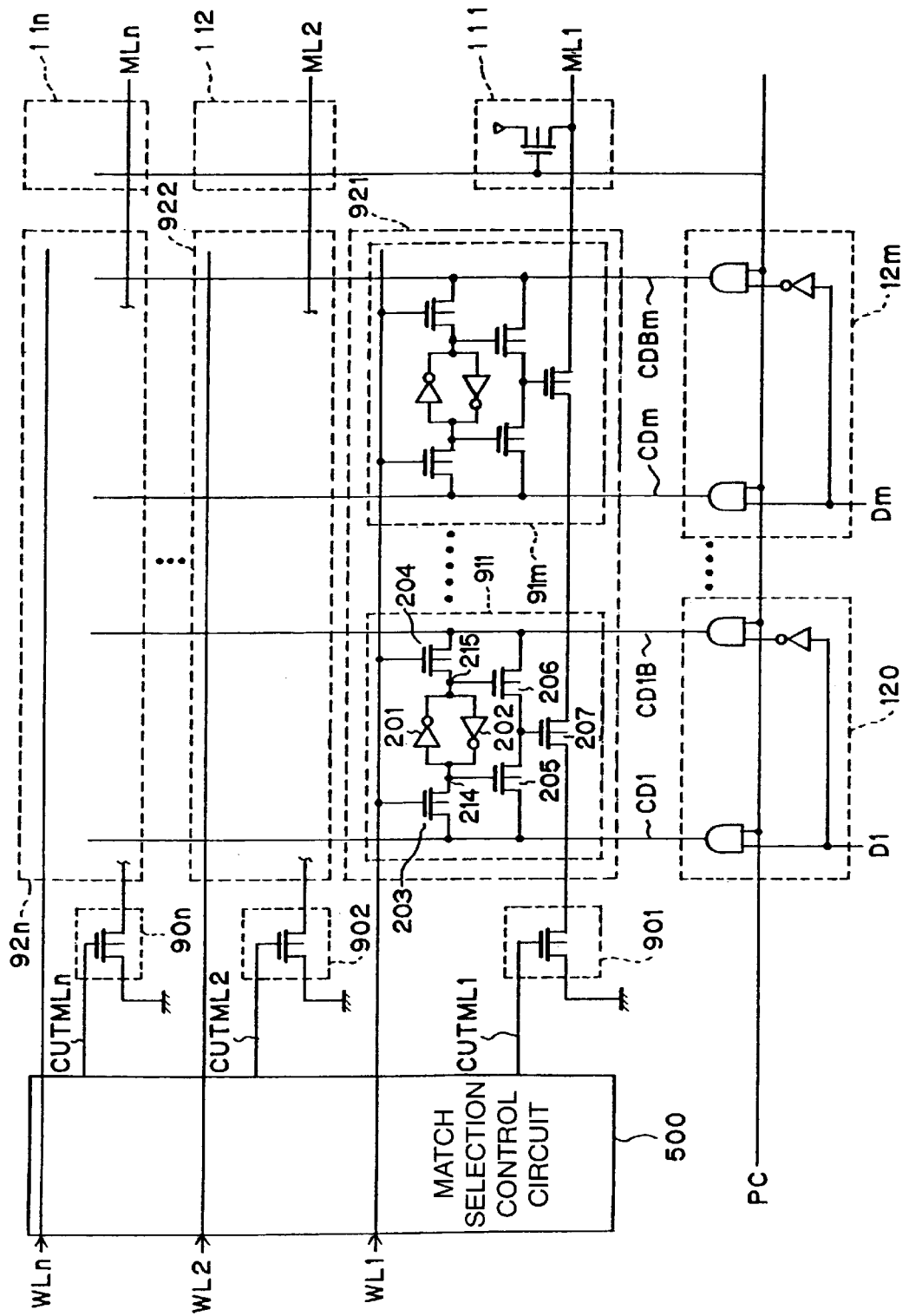
FIG. 5 is a diagram showing the construction of a circuit according to a second embodiment of the present invention.
Figure 6:
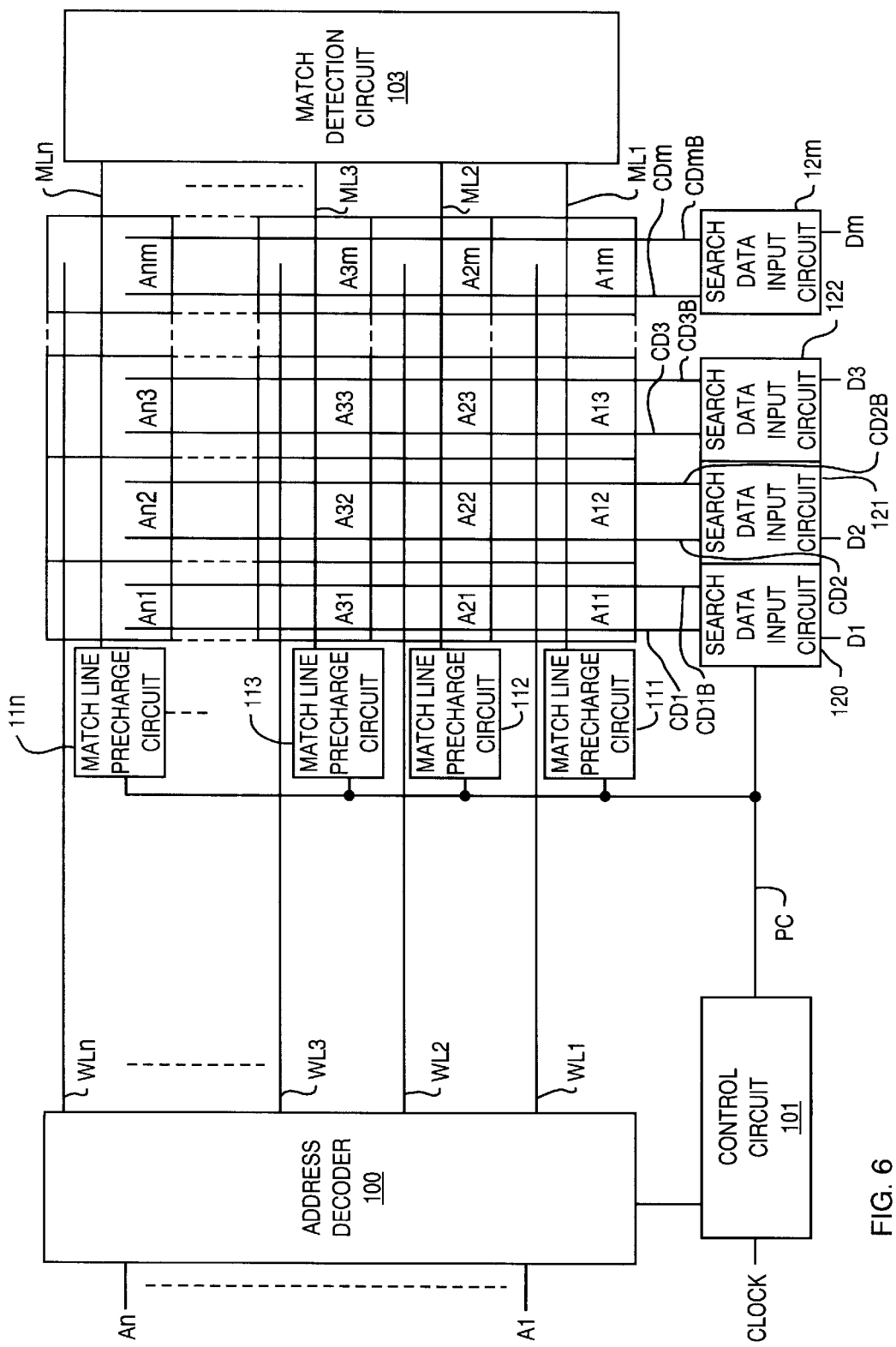
FIG. 6 is a block diagram illustrating the construction of a content-addressable memory according to the prior art.

FIG. 5 illustrates the construction of a second embodiment of the present invention. In the first embodiment, the connection of the match lines of the CAM cells is based upon OR logic in terms of the results of a search. In the second embodiment of the invention, however, the connection is based upon AND logic in terms of the search results.

As shown in FIG. 5, CAM cells 911–91n have the same construction as the CAM cells of the prior art shown in FIG. 7. Some of the connections, however, are different. In FIG. 5, the diffusion layer of the NMOS transistor 207, that is connected to GND in FIG. 7, is connected to the d diffusion layer of the NMOS transistor 207 of the neighboring CAM cell. The diffusion layer of the first NMOS transistor 207 of the CAM cells in each row direction is connected to the match selection circuit (901–90n) of the corresponding row.

The diffusion layer of the last NMOS transistor 207 of the CAM cells in the row direction is connected to the match line precharging circuit (111–11n) of the corresponding row.

The pair of search data lines CD1, CD1B connect all of the CAM cells of the column. The data input D1 is the input to the search data input circuit 120, which is controlled by precharge signal PC to transmit the search data over the pair of search data lines CD1, CD1B.

The search data line CD1B transmits data that is the inverse of the data on the search data line CD1. The same holds true for the other pair of search data lines CDm, CDmB. The search data input circuits are arranged on a column-by-column basis.

A word (line) structure 921 in the row direction of the CAM cells comprises m-number of CAM cells all connected by the word line WL1 and match line ML1 in the row direction. Other word (line) structures 922–92n in the row direction of the CAM cells also are all connected by word lines WL2–WLn.

The match line precharging circuit 111 is constituted by a PMOS transistor. The precharge signal PC is input to the gate of the PMOS transistor, one diffusion layer thereof is connected to VDD and the other diffusion layer thereof is connected to the match line ML1 of the row-direction CAM cells. One match line precharging circuit is provided for each row-direction word line and precharges the corresponding match line depending upon the content of the precharge signal PC.

The match selection circuit 901 is constituted by a PMOS transistor. The PMOS transistor has a gate to which the match line inhibit signal CUTML1 is applied, one diffusion layer connected to ground and another diffusion layer connected the diffusion layer of the NMOS transistor 207 of the CAM cell arranged in parallel in the row direction. One match selection circuit is provided for each word line in the row direction.

When the word line WL1 has been selected at the time of a data search in the CAM, the match line inhibit signal CUTML1 attains the GND level and the match line inhibit signals CUTML2–CUTMLn attain the VDD level.

When the result of a search is a non-match, the NMOS transistors 207 of the CAM cells (911–91m) turn off, as a result of which the match line ML1 remains at the precharge potential, as set forth above in the description of the prior art. The same holds true for the other match lines ML2–MLn.

When the result of a search is a match, all NMOS transistors 207 of the CAM cells (911–91m) of the word line WL1 turn on. The match line inhibit signal CUTML1 attains the ground level and the PMOS transistor of the match selection circuit 901 turns on. As a result, the match line ML1 is discharged from the precharge potential to the GND level. This is as set forth above in the description of the prior art.

The match line inhibit signals CUTML2–CUTMLn attain the VDD level and the PMOS transistors of the match selection circuits 902–90n turn off. As a result, the match lines ML2–MLn corresponding to the word lines WL2–WLn remain at the precharge potential and a data search is not carried out, in the same way as when the result of a data search is a non-match. Thus the data search range can be specified in terms of individual word lines by the position of the selected word line.

According to the first and second embodiments of the present invention, the invention is illustrated by a content-addressable memory circuit of single-column construction. However, the above-described embodiments can be applied to a multiple-column content-addressable memory circuit as well.

One effect of the present invention is that it is possible to reduce the number of search operations. The reason for this is as follows:

The conventional device is such that if multiple items of data that have been stored in the memories of CAM cells are identical when data is read out of another memory device using a detected address from the CAM, a search is conducted until the desired information is obtained, with the number of searches conducted amounting to the number of identical items of stored data. By contrast, in the present invention, the number of searches can be reduced by designating a data search range in terms of individual word lines (i.e., on the per-word-line basis).

Another effect of the present invention is that it is possible to reduce power consumption when the CAM operates. The reason for this is as follows:

The conventional device is such that when the result of a comparison in regard to an individual word line is indicative of a total match, all data search portions of the CAM cells operate, the potential on the match line charged prior to the search operation is discharged and needless power is consumed. By contrast, in the present invention, data search portions of CAM cells which operate on a per-word-line basis are eliminated by specifying a data search range. This makes it possible to reduce power consumption. For example, if the device has a 40 bit×1024 word 4-column construction and the data search range is half the entire word lines, then the reduction that can be achieved is 1.2 $\mu$A per cell or 1.5 mA overall.

As many apparently widely different embodiments of the present invention can be made without departing from the spirit and scope thereof, it is to be understood that the invention is not limited to the specific embodiments thereof or the specific combination of the elements disclosed as embodiments except as defined in the appended claims.

What is claimed is:

1. A content-addressable memory having an address decoder, a control circuit, search data input circuits for inputting retained data and search data to internal circuitry, match line precharge circuits for charging match lines, and a match detection circuit for detecting whether a match has been obtained on a match line, said content-addressable memory comprising:

a match selection control circuit, to which word lines that are the outputs of said address decoder are connected as inputs, for providing a predetermined potential as an inhibit signal for match lines that corresponds to all word lines of an order higher or lower than a word line that has been selected by said address decoder; and match selection circuits, which are connected to respective match lines and to which the match line inhibit signals from said match selection control circuit and a precharge signal for charging match lines from said control circuit are input, for discharging match lines that correspond to the match line inhibit signals.

2. The memory according to claim 1, wherein said predetermined potential is a power-supply potential.

3. The memory according to claim 1, wherein said match selection control circuit includes circuitry in which a word line of order 1 is connected to a match line inhibit signal of order 1 via a buffer, a match line inhibit signal of order 2 is transmitted by a signal formed as a combination of a word line of order 2 and the match line inhibit signal of order 1, and a match line inhibit signal of order n (where n is a natural number) is transmitted by a signal formed as a combination of the word line of order n and a match line inhibit signal of order n−1.

4. The memory according to claim 1, wherein said match selection control circuit includes circuitry in which said match selection control circuit includes circuitry in which a word line of order n (where n is a natural number) is connected to a match line inhibit signal of order n, a match line inhibit signal of order n−1 is transmitted by a signal formed as a combination of a word line of order n−1 and the match line inhibit signal of order n, and the match line inhibit signal of order 1 is transmitted by a signal formed as a combination of the word line of order 1 and the a match line inhibit signal of order 2.

5. The memory according to claim 1, wherein each of said match selection circuits includes a circuit which logically combines the match line inhibit signal and the precharge signal and has a switch function, said match selection circuit discharging the corresponding match line when said switch function is turned on.

6. A content-addressable memory for externally inputting search data, which comprises a plurality of bits, comparing the search data with internally stored data and determining whether the search data matches the internally stored data, said content-addressable memory comprising:

match selection circuits connected to respective ones of match lines, each commonly connecting all row-direction CAM cells of a corresponding row on the per-word-line basis; and a match selection control circuit for controlling said match selection circuits;

wherein by specifying, on the per-word-line basis, a data search range by a position of a word line that has been selected by an address decoder and by inhibiting compare search on the per-word-line basis outside the specified data search range, compare search is conducted only on the remaining individual word line(s) on the per-word-line basis.

7. The memory according to claim 6, wherein said match selection control circuit specifies the data search range by the position of the word line by specifying a word line which serves as a boundary word line of the data search range.

8. The memory according to claim 6, wherein said match selection circuit receives an inhibit signal from said match selection control circuit corresponding to a word line allocated to the match line, said inhibit signal inhibiting the match line from the compare search.

9. The memory according to claim 6, wherein each of said match lines is precharged to a predetermined potential according to a clock signal by a match line precharge circuit, and wherein said precharged potential of any of the match lines is discharged depending on the data search range.

10. The memory according to claim 9, wherein said discharging is carried out by said match selection circuit which receives a match line inhibit signal.

11. The memory according to claim 6, wherein the memory comprises match lines each of which is commonly connected with CAM cells in the row basis via a switching element in series connected to the match line, and wherein one end of the match line is connected to a precharge circuit, the other end thereof being connected to the match selection circuit which is controlled by a match line inhibit signal supplied by the match selection control circuit.

12. The memory according to claim 6, wherein said match selection circuit discharges the precharged match line.

13. The memory according to claim 11, wherein said match selection circuit discharges the precharged match line.

14. The memory according to claim 11, wherein said match line is connected with CAM cells allocated to the match line in a logical AND combination.

15. The memory according to claim 6, wherein said match line is connected with CAM cells allocated to the match line in a logical OR combination.

16. The memory according to claim 6, wherein there is provided a match detection circuit which detects output of match lines which are not inhibited from the compare search.

* * * * *